US007012008B1

(12) United States Patent
Shields et al.

(10) Patent No.: US 7,012,008 B1
(45) Date of Patent: Mar. 14, 2006

(54) DUAL SPACER PROCESS FOR NON-VOLATILE MEMORY DEVICES

(75) Inventors: Jeffrey A. Shields, Sunnyvale, CA (US); Tuan D. Pham, San Jose, CA (US); Mark T. Ramsbey, Sunnyvale, CA (US); Yu Sun, Saratogo, CA (US); Angela T. Hui, Fremont, CA (US); Maria Chow Chan, San Jose, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 824 days.

(21) Appl. No.: 09/728,554

(22) Filed: Dec. 1, 2000

Related U.S. Application Data

(60) Provisional application No. 60/190,475, filed on Mar. 17, 2000.

(51) Int. Cl.
*H01L 21/31* (2006.01)

(52) U.S. Cl. ............... 438/305; 438/258; 438/275; 438/303; 438/537; 438/595

(58) Field of Classification Search ............ 438/231, 438/241, 258, 275, 303, 305, 537, 595, FOR 188
See application file for complete search history.

(56) References Cited

U.S. PATENT DOCUMENTS

| 5,329,482 | A |   | 7/1994  | Nakajima et al. ........... 365/182 |
| 5,552,331 | A |   | 9/1996  | Hsu et al. ..................... 437/40 |
| 5,933,730 | A |   | 8/1999  | Sun et al. .................... 438/258 |
| 6,025,267 | A | * | 2/2000  | Pey et al. |
| 6,037,222 | A |   | 3/2000  | Huang et al. ............... 438/257 |
| 6,078,079 | A | * | 6/2000  | Ogoh |
| 6,133,130 | A | * | 10/2000 | Lin et al. |
| 6,153,459 | A | * | 11/2000 | Sun |
| 6,258,648 | B1 | * | 7/2001 | Lee |
| 6,380,584 | B1 | * | 4/2002 | Ogawa |

* cited by examiner

*Primary Examiner*—George Fourson
*Assistant Examiner*—Joannie Adelle Garcia
(74) *Attorney, Agent, or Firm*—Amin & Turocy, LLP

(57) ABSTRACT

In a two-step spacer fabrication process for a non-volatile memory device, a thin oxide layer is deposited on a wafer substrate leaving a gap in the core of the non-volatile memory device. Implantation and/or oxide-nitride-oxide removal can be accomplished through this gap. After implantation, a second spacer is deposited. After the second spacer deposition, a periphery spacer etch is performed. By the above method, a spacer is formed.

19 Claims, 1 Drawing Sheet

DUAL SPACER PROCESS FOR NON-VOLATILE MEMORY DEVICES

CROSS-REFERENCE TO RELATED APPLICATION

This application claims the benefit under 35 U.S.C. § 119(e) of the U.S. provisional application Ser. No. 60/190,475, filed on Mar. 17, 2000.

BACKGROUND OF THE INVENTION

This invention pertains to a spacer formation process for non-volatile memory devices. In particular, this invention is directed to a method for performing a two-step spacer deposition and etch resulting in the different appearance of a core and periphery of a non-volatile memory device. Additionally, this invention is related to a non-volatile memory device produced by the above method.

A semiconductor contains at least a core and periphery areas. Generally, memory information storage takes place in the core of a semiconductor. Additionally, storage of electronic charge also commonly occurs in the core. The core includes a plurality of core cells. The core cells are arranged in an ordered array known as a core cell array. Each core cell stores one or more bits of data for subsequent retrieval.

Commonly, adjacent the core is the periphery. One function of the periphery is to aid in correct circuitry selection for a certain memory location.

Charge is commonly stored in a separate polysilicon layer that is insulated both above and below the layer. Further, in an additional storage manner, charge is stored in a portion of the core generally known as the oxide-nitride-oxide (ONO) structure. Commonly, oxide functions as an insulator while nitride generally stores charge. The arrangement of the ONO structure facilitates the insulation of charge in the nitride layer by the nitride layer being sandwiched between two insulation oxide layers.

In one past method, the microchip formation process started with a silicon wafer substrate. On the silicon wafer, a bottom-most oxide layer is formed or deposited. This bottom-most oxide layer forms the bottom-most layer of the ONO structure of the core area.

The bottom and the top oxide layers of the ONO structure are formed generally in the same manner. In one manner, different gases, such as Silane, containing at least nitrogen dioxide, flow through a furnace. The silicon wafer and the oxygen from the nitrogen dioxide react to form an oxide layer. The oxide layer crystallizes on the wafer and/or the nitride layer.

The nitride layer, which is sandwiched between the two insulating oxide layers, is formed in a similar manner as the oxide layers. One way of nitride layer formation includes the use of different gases, such as Silane, containing at least silicon, hydrogen, and ammonia, flowing through a furnace. The silicon and the nitrogen from the ammonia react to form silicon nitride that crystallizes on the wafer.

While the core area typically has an ONO structure, the ONO structure is commonly etched away from the periphery area leaving only the bare silicon. A gate oxide is then commonly grown in a furnace on the bare silicon of the periphery area.

Once a gate oxide is grown on the bare periphery area, a doped polysilicon gate layer may be deposited on the gate oxide. The deposition of the polysilicon layer results in "seeds" of polysilicon formed on top of the gate oxide layer and the uppermost oxide layer of the ONO structure.

A prior method of spacer formation included blanket deposition of an oxide non-discriminately over the core and periphery of the wafer. Due to this blanket deposition, and particularly over the polysilicon line the spaces between and the area on top of the polysilicon line has a thinner deposition of oxide in comparison to the edges of the polysilicon lines. The edges of the polysilicon lines have a much thicker deposition of oxide. For example, when a blanket deposition of an oxide is deposited over polysilicon lines, approximately 1000 Angstroms of oxide fills in the space between polysilicon lines while approximately 2000 Angstroms or more of oxide fills in about the edges of the polysilicon lines. When a spacer etch is performed of approximately 1000 Angstroms, the etch will remove about 1000 Angstroms from the space between the two polysilicon lines. The spacer created at the edges of the polysilicon lines will not be entirely removed and will remain at the edge of the polysilicon lines due to a topographical effect. The height of the spacer at the edge of the polysilicon lines is due to the height (to the first degree) of the polysilicon lines. Whereas, the width of the spacer, that is, the amount it extends from the polysilicon lines into the space between two polysilicon lines, will be about ⅔ the length of the original spacer deposition. In the example immediately above of a deposition of 1000 Angstroms of an oxide, a spacer of an oxide deposition of approximately a 600 to a 650 Angstrom width extending outward and into the space located between to polysilicon lines will be formed.

In some prior methods, vertical etching was performed to form a spacer between the polysilicon lines. The etch uniformly removed oxide between the polysilicon lines and above the polysilicon lines. Yet, due to a topographical effect, the vertical spacer etch still left a thicker oxide layer at the edge of the polysilicon lines. For example, if approximately 2000 Angstroms of oxide was deposited at the edge of a polysilicon line, the spacer vertical etch would remove only approximately 1000 Angstroms of oxide while leaving approximately 1000 Angstroms of oxide at the edge. Upon deposition and prior to etch, the deposition of the oxide in the area that will form the spacer at the edge of the polysilicon lines is substantially thicker than the deposition occurring between the polysilicon lines. Little if any oxide deposition may be left between the polysilicon lines, beyond that at the edge of the polysilicon lines, after the spacer etch is performed.

The oxide spacer acts as a mask for the polysilicon line prior to the implantation step. In non-volatile memory device manufacture, it is desirable to dope the area between the polysilicon lines. Doping the silicon between the polysilicon lines forms source and drain areas. Therefore, it is generally desirable to mask or "cover" certain areas of the wafer to prevent implantation at those areas. The oxide spacer blocks the implants from being too close to the polysilicon line. It does so by "spacing" the implants from the transistor area. The etch removes the mask so implantation may occur.

Using prior methods, the non-volatile memory device core may nearly completely fill with the oxide spacer. In prior methods, the manner in which the oxide is deposited results in the polysilicon lines appearing as if they had grown together. Then, when the spacer etch is performed, hardly any exposed silicon results in the area between polysilicon lines. The presence of the oxide covering the area between the two polysilicon lines makes implantation more difficult. Therefore, by some of the prior methods, implantation in the area between the polysilicon lines had to occur before core spacer formation.

BRIEF SUMMARY OF THE INVENTION

The present invention relates to an improvement in semiconductor devices, and a method for making such semiconductor devices. The following description is presented to enable one of ordinary skill in the art to make and use the illustrative embodiment and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

In one aspect of the present invention, a first oxide layer is deposited over the polysilicon lines. The first oxide deposition covers the area above the polysilicon lines as well as the area between polysilicon lines. This first oxide deposition does not fill up the space between the polysilicon lines. Following the first oxide deposition, the core and periphery areas may be etched removing a portion of the deposition. A spacer is formed adjacent the edge of the polysilicon lines. Subsequently, the area between polysilicon lines may be implanted or doped. The different structure of the core and periphery is provided by performing core specific implants, doping, or ONO/gate oxide removal in the gap between polysilicon lines defined by the first spacer. Next, a second oxide spacer may be deposited over the periphery and core. Unless either or both the periphery and core has been masked off with a resist, the second spacer is formed in both the periphery and the core. The second spacer width is defined by periphery circuit needs. Subsequent the second spacer deposition, a second spacer etch is performed over both the core and periphery but targeted to the particular needs of the periphery.

DETAILED DESCRIPTION OF THE INVENTION

Figure 1:
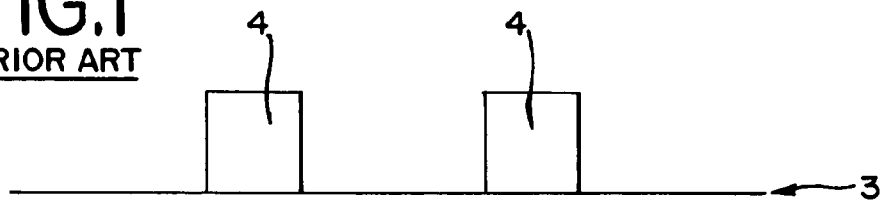
FIG. 1 shows a side view of a prior art non-volatile memory device after poly-etching showing two polysilicon lines.
Figure 2:
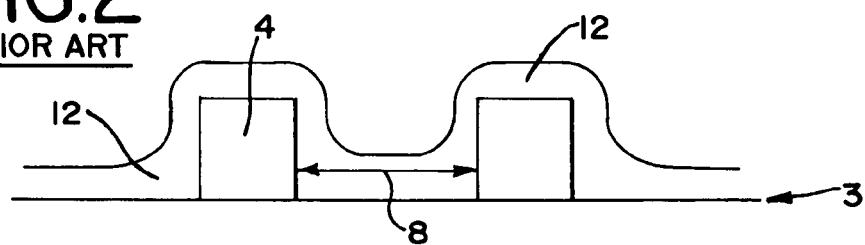
FIG. 2 shows a prior art side view of a non-volatile memory device after the first spacer deposition.
Figure 3:
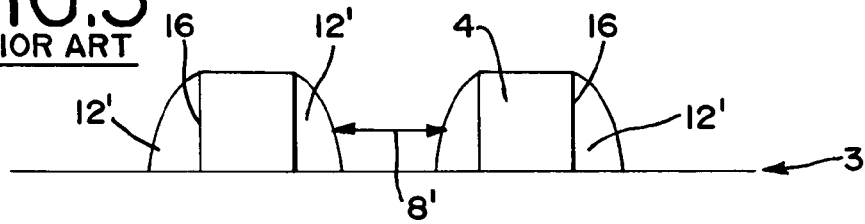
FIG. 3 shows a prior art non-volatile memory device after the first spacer etch.

In FIG. 1 shows a prior art non-volatile memory device 1 after polysilicon etching. Two polysilicon lines 4 are deposited on the substrate 3. FIG. 2 shows a prior art non-volatile memory device 1 after a first oxide layer 12 is deposited over and in the area 8 between the two polysilicon lines 4. In FIG. 3, a prior art non-volatile memory device 1 is shown after performance of a first spacer etch showing the spacer 12' (where prime in the figures represents a spacer formed from the oxide layer deposition). Implantation occurs in implantation area 8'.

Figure 4:
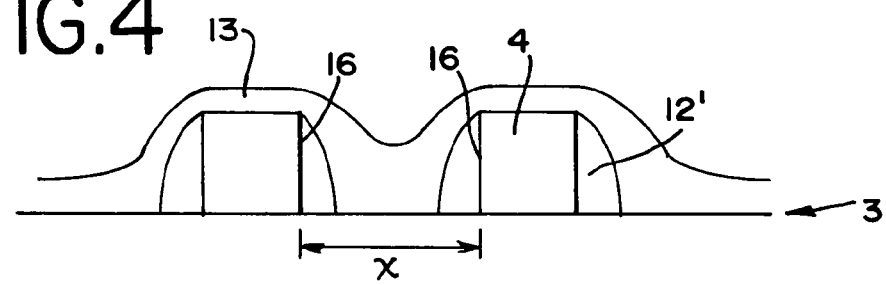
FIG. 4 shows a side view of an oxide or nitride spacer between two polysilicon lines of an embodiment of the present invention.
Figure 5:
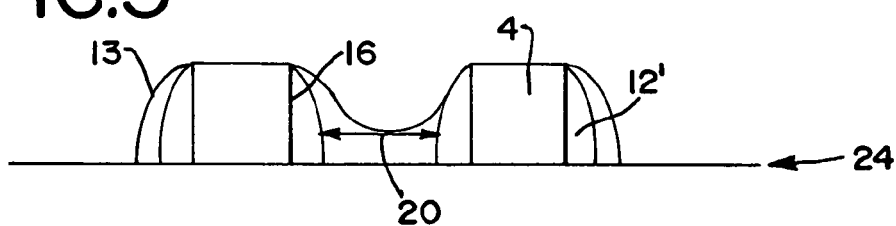
FIG. 5 shows a side view of the core area after the second spacer etch one embodiment of the non-volatile memory device.
Figure 6:
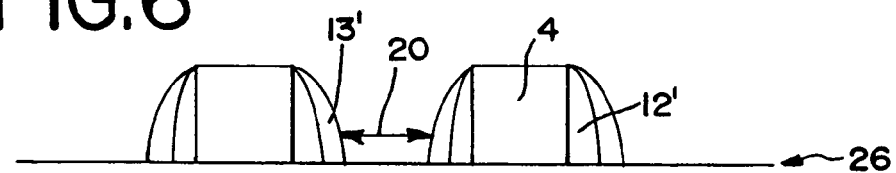
FIG. 6 shows a side view of the core area after the second spacer etch of an embodiment of the non-volatile memory device.

As shown in FIG. 4, in one aspect of the present invention, a first oxide layer 12 is deposited over the polysilicon lines 4. The first oxide layer 12 covers the area above the polysilicon lines 4 as well as the area x between polysilicon lines 4. This first oxide layer 12 does not completely fill up or level off the area x between the polysilicon lines 4. After the deposition of first oxide layer 12, the area x between polysilicon lines 4 in both the core 24 and periphery 28 is etched. This forms spacer 12'. Following the formation of spacer 12' a portion of the gate oxide may be removed. Subsequently, an implantation area 20 between the polysilicon lines 4 may be implanted or doped. Next, as shown in FIGS. 4 and 5, a second oxide spacer 13 may be formed in the periphery 28 and core 24. Subsequent the formation of second spacer 13' deposition, a second spacer etch is performed over the periphery 28 area and core 24. The doping of the periphery effects the appearance of the periphery 28. As shown in FIG. 6, this second etch provides for a near absence of implant in the area between the polysilicon lines 4 in the periphery 28 of the non-volatile memory device 1. This is in contrast to the core 24 of the non-volatile memory device 1 that, after the second spacer etch, still has dopants implanted into the silicon located between the spacers 12' and under the spacer 13'.

The first oxide layer 12 has an approximate thickness of less than one-half x (½x) where x represents the distance between the edges 16 of each polysilicon line 4. For example, if the distance between edges 16 of the two polysilicon lines 4 is approximately 1000 Angstroms, less than 500 Angstroms of a spacer deposition would be used to fill the gap between the two edge areas 16 of the polysilicon lines 4.

At some point after the deposition of first oxide layer 12, which is of a generally reduced thickness than commonly applied, a spacer etch forms a space between the first polysilicon lines 4 by removing some of the oxide layer 12 which was deposited. In the resulting space 20, implantation or removal of the ONO or gate oxide can occur. After implantation occurs, the deposition of a second oxide layer 13"; is performed. The amount of the deposition of second oxide layer 13 is dependent upon the overall spacer 12' requirements. For example, if the deposition requirement overall of the spacer 12' is approximately 1000 Angstroms, and in the first oxide layer 12 less than 500 Angstroms was deposited, the second oxide layer 13 is sufficient to produce a 1000 Angstrom deposition overall in the area between the two polysilicon lines 4.

FIG. 4 depicts the non-volatile memory device 1 after the deposition 13 of the second oxide layer. FIG. 5 depicts one embodiment of the core 24 of the non-volatile memory device 1 after the second spacer etch. Implantation or doping occurs in the area 20 formed after the first spacer etch located between the two polysilicon lines 4. FIG. 6 represents one embodiment of the periphery 28 of the non-volatile memory device 1 after the second spacer etch. As is apparent, the core area 24 after the second spacer etch is devoid or nearly devoid of oxide and has generally the appearance of FIG. 6. If the core 24 area is masked in the implantation area 20 of the silicon wafer or substrate, then oxide deposition may still be found between the first spacers 12' and the core 24 has generally the appearance of FIG. 5. Whereas, in contrast, the periphery 28 does not have oxide remaining in the area located between the first spacer 12' as generally in FIG. 6. One embodiment of a nonvolatile memory device 1 made by the method of the present invention has a distinguishable core 24 and periphery 28 area.

In an alternative embodiment, the core 24 and the periphery 28 of the integrated circuit both have the appearance of the circuit as depicted in FIG. 6. In this embodiment, the implants located in the implantation area 20 in the core 24 and the periphery 28 differ. This difference in implant between the core 24 and the periphery 28 can be accomplished by masking the core 24 and/or periphery 28 during implantation.

In yet another embodiment, implantation of core 24 occurs after the performance of first spacer etch. Whereas, implantation occurs in the periphery 28 only after both the deposition of the layers 12, 13 performed first and the second oxide layer 12, 13 is performed and the second spacer etch. In order not to etch the core 24 during the second spacer etch, the core 24 is covered with resist during the second spacer etch. In this manner, the core 24 receives neither the second deposition nor undergoes the second spacer etch. The resulting core 24 has the appearance depicted in FIG. 5. The periphery has the resulting appearance of FIG. 6.

In yet a further embodiment, implantation of periphery 28 occurs after the performance of first spacer etch. Whereas, implantation occurs in the core 24 only after both the deposition of the performed first and the second oxide layers 12, 13 is performed and the second spacer etch. In order not to etch the periphery 28 during the second spacer etch, the periphery 28 is covered with resist during the second spacer etch. In this manner, the periphery 28 receives neither the second deposition nor undergoes the second spacer etch. The resulting core 24 has the appearance depicted in FIG. 6. The periphery 28 has the resulting appearance of FIG. 5.

The discussion above is descriptive, illustrated and exemplary and not to be taken as limiting the scope defined by the appended claims. Of course, it should be understood that a wide range of changes and modifications could be made to the embodiment described above. For example, the thickness of the oxide layers may vary. Thus, it is intended that the foregoing detailed description be regarded as illustrative rather than limiting and that it be understood that it is the following claims, including all equivalents, which are intended to define the scope of this invention.

What is claimed is:

1. A method for forming a spacer, comprising:
   depositing a first oxide layer over at least two adjacent polysilicon lines in each of a core area and a periphery area;
   performing a first spacer etch in the core area and the periphery area;
   implanting an area located between at least two adjacent polysilicon lines in the core area;
   applying a second oxide layer over the core area and the periphery area; and
   performing a second spacer etch over the periphery area, the core area retaining an amount of the second oxide between the adjacent polysilicon lines while the periphery area is deplete of the second oxide between its adjacent polysilicon lines.

2. The method of claim 1 wherein the first oxide layer has a thickness of less than one-half the distance between adjacent polysilicon lines.

3. The method of claim 1, further comprising implanting an area located between at least two adjacent polysilicon lines in the periphery area.

4. The method of claim 3, the implanting of the area located between at least two polysilicon lines in the periphery area occurring subsequent to performing the first spacer etch.

5. The method of claim 1, the implanting of the area located between at least two adjacent polysilicon lines occurs after application of the second spacer etch.

6. The method of claim 1, prior to performing the second spacer etch depositing resist over the periphery area.

7. The method of claim 1, prior to implanting an area between at least two adjacent polysilicon lines masking the core area and the periphery area.

8. A process for fabricating a non-volatile memory device comprising:
   providing a substrate having a core are, a periphery area, and at least two adjacent polysilicon lines in each of the core area and the periphery area;
   depositing a first oxide layer over the adjacent polysilicon lines, the first oxide layer has a thickness of less than one-half the distance between adjacent polysilicon lines;
   performing a first spacer etch in the core area and the periphery area;
   implanting an area located between at least two adjacent polysilicon lines in the core area;
   depositing a second oxide layer over the core area and the periphery area; and
   performing a second spacer etch over the periphery area.

9. The process of claim 8, further comprising performing a second spacer etch over the core area.

10. The process of claim 8, the implanting of an area occurs after the performing of the first spacer etch.

11. The process of claim 8, further comprising implanting an area located between at least two polysilicon lines in the periphery area.

12. The process of claim 11, the implanting of an area located between at least two polysilicon lines in the periphery area occurs after the performing of the first spacer etch.

13. The process of claim 11, the implanting of an area located between at least two polysilicon lines in the core area occurs after the performing of the second spacer etch.

14. The process of claim 8, the substrate is a silicon wafer.

15. The process of claim 8, the depositing of the first oxide layer comprising passing nitrogen dioxide gas over the substrate.

16. The process of claim 8, farther comprising depositing a nitride layer between the first oxide layer and the second oxide layer.

17. The process of claim 16, the depositing of the nitride layer comprising passing a gas composed of at least silicon, hydrogen and ammonia.

18. The process of claim 8, the depositing of the first oxide layer partially fills an interstitial gap between adjacent polysilicon lines.

19. The process of claim 8, the core area retaining an amount of the second oxide between adjacent polysilicon lines while the periphery area is deplete of the second oxide between its adjacent polysilicon lines.

* * * * *